United States Patent
Oh et al.

(10) Patent No.: US 9,166,144 B2
(45) Date of Patent: Oct. 20, 2015

(54) MAGNETIC DEVICES HAVING PERPENDICULAR MAGNETIC TUNNEL JUNCTION

(71) Applicants: SeChung Oh, Suwon-si (KR); Ki Woong Kim, Yongin-si (KR); Younghyun Kim, Seoul (KR); Whankyun Kim, Seoul (KR); Sang Hwan Park, Hwaseong-si (KR)

(72) Inventors: SeChung Oh, Suwon-si (KR); Ki Woong Kim, Yongin-si (KR); Younghyun Kim, Seoul (KR); Whankyun Kim, Seoul (KR); Sang Hwan Park, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/535,315

(22) Filed: Nov. 6, 2014

(65) Prior Publication Data

US 2015/0061059 A1 Mar. 5, 2015

Related U.S. Application Data

(63) Continuation of application No. 13/987,150, filed on Jul. 2, 2013, now Pat. No. 8,907,436, and a continuation-in-part of application No. 13/838,598, filed on Mar. 15, 2013, now abandoned, and a continuation-in-part of application No. 13/091,215, filed on Apr. 21, 2011, now Pat. No. 8,476,722.

(30) Foreign Application Priority Data

Aug. 21, 2012 (KR) ........................ 10-2012-0091484

(51) Int. Cl.
*H01L 29/82* (2006.01)
*H01L 43/02* (2006.01)
(Continued)

(52) U.S. Cl.
CPC ............ *H01L 43/02* (2013.01); *H01F 10/3254* (2013.01); *H01F 10/3286* (2013.01);
(Continued)

(58) Field of Classification Search
CPC ..... H01L 43/08; H01L 29/82; H01L 23/5226; H01L 23/528; H01L 27/222; H01L 43/065; G11C 11/16
USPC ...................... 257/421–427, E29.323; 438/3; 365/324–326; 360/157–158
See application file for complete search history.

(56) References Cited

U.S. PATENT DOCUMENTS

| | | | |
|---|---|---|---|
| 7,750,421 B2 | 7/2010 | Horng et al. | |
| 8,085,582 B2 | 12/2011 | Nakamura et al. | |
| 8,139,403 B2 | 3/2012 | Inokuchi et al. | |
| 2007/0086121 A1* | 4/2007 | Nagase et al. ............. | 360/324.1 |

(Continued)

FOREIGN PATENT DOCUMENTS

| JP | 2010080476 A | 4/2010 |
|---|---|---|
| KR | 20110035538 A | 4/2011 |
| KR | 20120011372 A | 2/2012 |

*Primary Examiner* — Jami M Valentine
(74) *Attorney, Agent, or Firm* — Renaissance IP Law Group LLP

(57) ABSTRACT

Provided are magnetic memory devices with a perpendicular magnetic tunnel junction. The device includes a magnetic tunnel junction including a free layer structure, a pinned layer structure, and a tunnel barrier therebetween. The pinned layer structure may include a first magnetic layer having an intrinsic perpendicular magnetization property, a second magnetic layer having an intrinsic in-plane magnetization property, and an exchange coupling layer interposed between the first and second magnetic layers. The exchange coupling layer may have a thickness maximizing an antiferromagnetic exchange coupling between the first and second magnetic layers, and the second magnetic layer may exhibit a perpendicular magnetization direction, due at least in part to the antiferromagnetic exchange coupling with the first magnetic layer.

20 Claims, 11 Drawing Sheets

(51) Int. Cl.
*H01F 10/32* (2006.01)
*H01L 43/08* (2006.01)
*H01L 43/10* (2006.01)
*B82Y 25/00* (2011.01)
*H01F 10/12* (2006.01)
*H01L 27/22* (2006.01)

(52) U.S. Cl.
CPC ............ *H01F10/3295* (2013.01); *H01L 43/08* (2013.01); *H01L 43/10* (2013.01); *B82Y 25/00* (2013.01); *H01F 10/123* (2013.01); *H01F 10/3272* (2013.01); *H01L 27/224* (2013.01); *H01L 27/226* (2013.01); *H01L 27/228* (2013.01)

(56) References Cited

U.S. PATENT DOCUMENTS

| | | |
|---|---|---|
| 2008/0198514 A1 | 8/2008 | Jogo et al. |
| 2009/0015958 A1 | 1/2009 | Nakamura et al. |
| 2009/0027810 A1 | 1/2009 | Horng et al. |
| 2010/0032738 A1* | 2/2010 | Zhu .............................. 257/295 |
| 2011/0062537 A1 | 3/2011 | Oh et al. |
| 2011/0228596 A1 | 9/2011 | Inokuchi et al. |
| 2011/0233697 A1 | 9/2011 | Kajiyama |
| 2011/0260272 A1 | 10/2011 | Lee et al. |
| 2012/0023386 A1 | 1/2012 | Oh et al. |
| 2012/0042081 A1 | 2/2012 | Liao et al. |
| 2012/0043631 A1 | 2/2012 | Ohmori et al. |
| 2012/0063220 A1 | 3/2012 | Higo et al. |
| 2014/0299950 A1* | 10/2014 | Kim et al. ..................... 257/421 |

* cited by examiner

US 9,166,144 B2

MAGNETIC DEVICES HAVING PERPENDICULAR MAGNETIC TUNNEL JUNCTION

CROSS-REFERENCE TO RELATED APPLICATIONS

This application is a continuation of U.S. patent application Ser. No. 13/987,150, filed Jul. 2, 2013, which claims priority to Korean Patent Application No. 10-2012-0091484, filed Aug. 21, 2012, the entire contents of which are hereby incorporated by reference. U.S. patent application Ser. No. 13/987,150 is a continuation-in-part of, and claims priority under 35 U.S.C. §120 to, U.S. patent application Ser. No. 13/838,598, filed on Mar. 15, 2013, now abandoned, which is a continuation of U.S. patent application Ser. No. 12/862,074, filed on Aug. 24, 2010, which claims priority to Korean Patent Application No. 10-2009-0086084, filed on Sep. 11, 2009 and Korean Patent Application No. 10-2009-0093306, filed on Sep. 30, 2009, the entire contents of which are hereby incorporated by reference. U.S. patent application Ser. No. 13/987,150 is also a continuation-in-part of, and claims priority under 35 U.S.C. §120 to, U.S. patent application Ser. No. 13/091,215, filed on Apr. 21, 2011, now U.S. Pat. No. 8,476,722, which claims priority to Korean Patent Application No. 10-2010-0037017, filed on Apr. 21, 2010, the entire contents of which are hereby incorporated by reference.

BACKGROUND

Example embodiments of the inventive concept relate to a semiconductor device, and in particular, to magnetic device such as magnetic memory devices having a perpendicular magnetic tunnel junction.

With the increasing use of portable computing devices and wireless communication devices, semiconductor devices may require higher density, lower power, and/or nonvolatile properties. Magnetic memory devices may be able to satisfy the aforementioned technical requirements.

An example data storing mechanism for a magnetic memory device is a tunnel magneto resistance (TMR) effect of a magnetic tunnel junction (MTJ). With the TMR effect, the magnetic orientations of the MTJ can be controlled by spin-torque switching. For example, a magnetic memory device with a MTJ have been developed such that an MTJ may have a TMR ratio of several hundred to several thousand percent.

SUMMARY

Example embodiments of the inventive concept provide magnetic devices including a perpendicular magnetic tunnel junction.

Other example embodiments of the inventive concept provide magnetic devices having a perpendicular magnetic tunnel junction with a reduced thickness.

Still other example embodiments of the inventive concept provide magnetic devices having a perpendicular magnetic tunnel junction configured to reduce a magnetic interaction between free and pinned layers.

In some embodiments, a magnetic device comprises a free layer structure, a pinned layer structure, and a tunnel barrier therebetween, wherein at least one of the pinned layer structure or the free layer structure comprises a first magnetic layer having an intrinsic perpendicular magnetization property, a second magnetic layer having an intrinsic in-plane magnetization property, and an exchange coupling layer interposed between the first and second magnetic layers. The exchange coupling layer may have a thickness selected to provide a desirable amount of antiferromagnetic exchange coupling between the first and second magnetic layers, such that the second magnetic layer exhibits an extrinsic perpendicular magnetization direction due at least in part to the antiferromagnetic exchange coupling with the first magnetic layer.

In some embodiments, the amount of antiferromagnetic exchange coupling may be at least 4,000 Oe.

In some embodiments, a ratio of a saturation magnetization value of the second magnetic layer over a saturation magnetization value of the first magnetic layer ranges between about 0.6-about 1.5.

In some embodiments, a saturation magnetization value of the first magnetic layer is substantially the same as a saturation magnetization value of the second magnetic layer. In some embodiments, the saturation magnetization value of each of the first and second magnetic layer may range from about 600 to 1400 emu/cc.

In some embodiments, the exchange coupling layer is ruthenium, iridium, or rhodium.

In some embodiments, the thickness of the exchange coupling layer is about 2.5 Å to about 7 Å.

In some embodiments, the thickness of the exchange coupling layer is about 3 to about 4 Å.

In some embodiments, a thickness of the first magnetic layer ranges from about 10 Å to about 80 Å and a thickness of the second magnetic layer ranges from about 5 Å to about 20 Å

In some embodiments, a $K_u$ value of the first magnetic layer is at least $3\times10^6$ erg. The Ku value is a perpendicular magnetic anisotropic energy (i.e., magnetic anisotropic energy in the direction perpendicular to the plane of the first magnetic layer).

In some embodiments, the first magnetic layer comprises a single layer of cobalt base alloy.

In some embodiments, the first magnetic layer comprises a multi-layer stack of $(Co_x/Pt_y)n$. In some embodiments, x/y may range from 0.5 to 1.5.

In some embodiments, a magnetic device comprises a magnetic tunnel junction including a free layer structure, a pinned layer structure, and a tunnel barrier therebetween, The pinned layer structure may have a first magnetic layer having an intrinsic perpendicular magnetization property, a second magnetic layer having an intrinsic in-plane magnetization property, and an exchange coupling layer interposed between the first and second magnetic layers. The exchange coupling layer may have a thickness selected to provide a desirable amount of antiferromagnetic exchange coupling between the first and second magnetic layers, and the second magnetic layer exhibits an extrinsic perpendicular magnetization direction as a result of the antiferromagnetic exchange coupling with the first magnetic layer.

According to example embodiments of the inventive concepts, a magnetic device may include a magnetic tunnel junction including a free layer structure, a pinned layer structure, and a tunnel barrier therebetween. The pinned layer structure may include a first magnetic layer having an intrinsic perpendicular magnetization property, a second magnetic layer having an intrinsic in-plane magnetization property, and an exchange coupling layer interposed between the first and second magnetic layers. The exchange coupling layer may have a thickness selected to provide a desirable amount of antiferromagnetic exchange coupling between the first and second magnetic layers, and the second magnetic layer may exhibit an extrinsic perpendicular magnetization direction, as a result of the antiferromagnetic exchange coupling with the first magnetic layer. An exchange coupling intensity of the magnetic tunnel junction may range from about 4,000 to about 10,000 Oe.

In example embodiments, the thickness of the exchange coupling layer may be selected in such a way that the second magnetic layer can have a perpendicular magnetization antiparallel to a magnetization direction of the first magnetic layer.

In example embodiments, the exchange coupling layer may be formed of at least one of ruthenium, iridium, or rhodium.

In example embodiments, the thickness of the exchange coupling layer ranges from about 2.5 Å to about 5.0 Å.

In example embodiments, the first magnetic layer may include at least one of 1) a single-layer structure made of cobalt-platinum alloy or cobalt-platinum alloy added with an element X, where the element X may be at least one of boron, ruthenium, chromium, tantalum, or oxide, or 2) a multi-layer structure including cobalt-containing layers and noble metal layers alternatingly stacked on each other. The cobalt-containing layers may be formed of one of cobalt, cobalt iron, cobalt nickel, or cobalt chromium, and the noble metal layers may be formed of one of platinum and palladium.

In example embodiments, the second magnetic layer may be a single- or dual-layered structure including at least one of Co, CoFeB, CoFeBTa, CoHf, or CoZr.

In example embodiments, the free layer structure may include a free layer having the intrinsic in-plane magnetization property, and a non-magnetic metal oxide layer inducing a perpendicular magnetization property to the free layer.

In example embodiments, the free layer may be a single- or multi-layer structure including at least one of Fe, Co, Ni, CoFe, NiFe, NiFeB, CoFeB, CoFeBTa, CoHf, CoFeSiB or CoZr.

In example embodiments, the non-magnetic metal oxide layer may be a single- or multi-layer structure including at least one of tantalum oxide, magnesium oxide, ruthenium oxide, iridium oxide, platinum oxide, palladium oxide, or titanium oxide and being in direct contact with the free layer.

In example embodiments, the device may further include a first conductive element connecting the magnetic tunnel junction to a switching device, and a second conductive element connecting the magnetic tunnel junction to an interconnection line. The free layer structure may be interposed between the first conductive element and the tunnel barrier or between the second conductive element and the tunnel barrier.

According to example embodiments of the inventive concepts, a magnetic device may include a magnetic tunnel junction including a free layer structure, a pinned layer structure, and a tunnel barrier therebetween. Each of the free and pinned layer structures may include an in-plane layer having an intrinsic in-plane magnetization property and a perpendicularing layer inducing a perpendicular magnetization property to the in-plane layer. The perpendicularing layer of the free layer structure may include a non-magnetic metal oxide layer, and the perpendicularing layer of the pinned layer structure may include an exchange coupling layer and a perpendicular layer having an intrinsic perpendicular magnetization property. The exchange coupling layer may have a thickness selected in such a way that the perpendicular layer and the in-plane layer of the pinned layer structure may be subjected to an antiferromagnetic exchange coupling therebetween.

In some embodiments, the magnetic device may further include a lower electrode, an upper electrode, the magnetic tunnel junction disposed between the lower electrode and the upper electrode, and a total thickness of the magnetic device may be smaller than about 15 nm.

In example embodiments, the exchange coupling layer may be disposed between the perpendicular layer and the in-plane layer of the pinned layer structure, and the non-magnetic metal oxide layer may be provided to cover directly the in-plane layer of the free layer structure.

In example embodiments, the exchange coupling layer may be formed of at least one of ruthenium, iridium, or rhodium.

In example embodiments, the exchange coupling layer may have the thickness maximizing the antiferromagnetic exchange coupling between the perpendicular layer and the in-plane layer of the pinned layer structure.

In example embodiments, the thickness of the exchange coupling layer may range from about 2.5 Å to about 5.0 Å.

In example embodiments, the non-magnetic metal oxide layer may be a single- or multi-layer structure including at least one of tantalum oxide, magnesium oxide, ruthenium oxide, iridium oxide, platinum oxide, palladium oxide, or titanium oxide.

In example embodiments, the perpendicular layer may include at least one of cobalt-containing perpendicular magnetic materials.

In example embodiments, the perpendicular layer may be formed of cobalt-platinum alloy or cobalt-platinum alloy added with an element X, where the element X may be at least one of boron, ruthenium, chromium, tantalum, or oxide.

In example embodiments, the perpendicular layer may be a multi-layer structure including cobalt-containing layers and noble metal layers alternatingly stacked on each other, the cobalt-containing layers may be formed of one of cobalt, cobalt iron, cobalt nickel, and cobalt chromium, and the noble metal layers may be formed of one of platinum and palladium.

In example embodiments, the perpendicular layer may be a dual-layer structure including a first perpendicular layer and a second perpendicular layer, and each of the first and second perpendicular layers comprises: a layer of cobalt-platinum alloy or cobalt-platinum alloy added with an element X, where the element X may be at least one of boron, ruthenium, chromium, tantalum, or oxide, or a multi-layer structure including cobalt-containing layers and noble metal layers alternatingly stacked on each other. The cobalt-containing layers may be formed of one of cobalt, cobalt iron, cobalt nickel, and cobalt chromium, and the noble metal layers may be formed of one of platinum and palladium.

In example embodiments, the pinned layer structure may further include a cobalt layer or a cobalt-rich layer interposed between the exchange coupling layer and the perpendicular layer.

In example embodiments, the in-plane layer of the pinned layer structure may be a single- or multi-layer structure including at least one of cobalt, iron, or alloys thereof.

In example embodiments, the in-plane layer of the pinned layer structure may be a multi-layer structure including a pair of magnetic layers having the intrinsic in-plane magnetization property and a non-magnetic metal layer interposed therebetween.

In example embodiments, the in-plane layer of the pinned layer structure may be a single- or dual-layer structure including at least one of Co, CoFeB, CoFeBTa, CoHf, CoFeSiB or CoZr.

In example embodiments, the in-plane layer of the free layer structure may be a single- or multi-layer structure including at least one of cobalt, iron, nickel, or alloys thereof.

In example embodiments, the in-plane layer of the free layer structure may be a single- or multi-layer structure including at least one of Fe, Co, Ni, CoFe, NiFe, NiFeB, CoFeB, CoFeBTa, CoHf, CoFeSiB or CoZr.

In example embodiments, the in-plane layer of the free layer structure may be a multi-layer structure including a pair of magnetic layers having the intrinsic in-plane magnetization property and a non-magnetic metal layer interposed therebetween. For example, the pair of the magnetic layers may be formed of CoFeB and the non-magnetic metal layer may be a tantalum layer having a thickness of about 2 Å-20 Å.

In example embodiments, the device may further include a first conductive element connecting the magnetic tunnel junction to a switching device, and a second conductive element connecting the magnetic tunnel junction to an interconnection line. The second conductive element may be a single- or multi-layer structure including at least one of noble metal layers, magnetic alloy layers, or metal layers.

In example embodiments, the free layer structure may be disposed closer to the first conductive element than to the second conductive element, and the pinned layer structure may be disposed closer to the second conductive element than to the first conductive element.

In example embodiments, the free layer structure may be disposed closer to the second conductive element than to the first conductive element, and the pinned layer structure may be disposed closer to the first conductive element than to the second conductive element.

BRIEF DESCRIPTION OF THE DRAWINGS

Example embodiments will be more clearly understood from the following brief description taken in conjunction with the accompanying drawings.

FIG. 1 is a circuit diagram exemplarily illustrating a unit memory cell of magnetic memory devices according to example embodiments of the inventive concept.

FIGS. 2 through 6 are circuit diagrams exemplarily illustrating selection devices according to example embodiments of the inventive concept.

FIG. 7 is a schematic diagram illustrating a first type of a magnetic tunnel junction according to example embodiments of the inventive concept.

FIG. 8 is a schematic diagram illustrating a second type of a magnetic tunnel junction according to example embodiments of the inventive concept.

FIG. 9 is a perspective view exemplarily illustrating a free layer structure constituting a magnetic tunnel junction according to example embodiments of the inventive concept.

FIG. 10 is a perspective view exemplarily illustrating a pinned layer structure constituting a magnetic tunnel junction according to example embodiments of the inventive concept.

FIG. 11 is a graph provided to describe some aspects of the inventive concept.

FIG. 12 is a sectional view exemplarily illustrating a magnetic tunnel junction according to example embodiments of the inventive concept.

FIG. 13 is a cross-sectional view exemplarily illustrating a magnetic tunnel junction according to other example embodiments of the inventive concept.

FIG. 14 is a cross-sectional view exemplarily illustrating a magnetic tunnel junction according to other example embodiments of the inventive concept.

FIG. 15 is a flow chart exemplarily illustrating a method of fabricating a magnetic device according to some embodiments of the inventive concepts.

Figure 1:
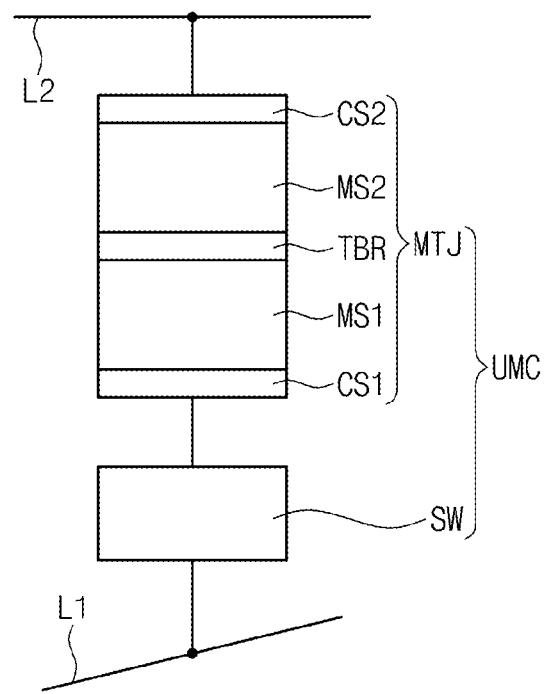
FIGS. 1 through 15 represent non-limiting, example embodiments as described herein.
Figure 2:
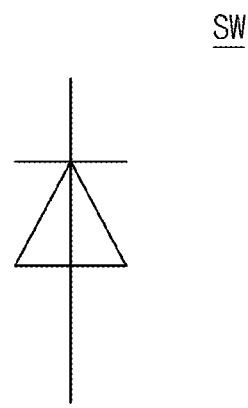
Figure 3:
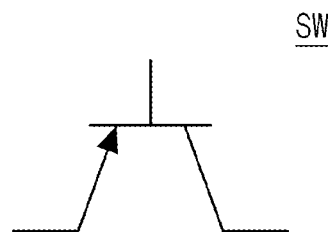
Figure 4:
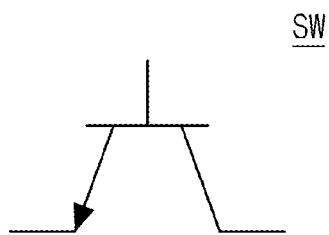
Figure 5:
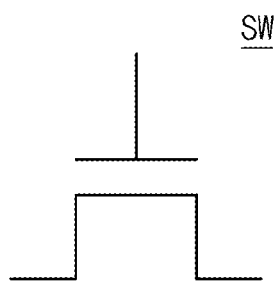
Figure 6:
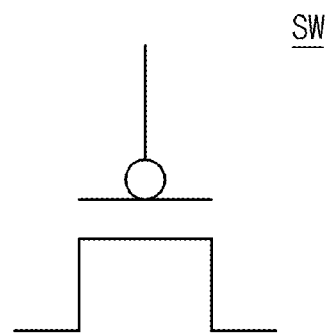

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Perpendicular magnetic tunnel junctions and technical features related thereto were disclosed in U.S. patent application Ser. Nos. 12/862,074, 13/181,957, and 13/398,617, filed on Aug. 24, 2010, Jul. 13, 2011, and Feb. 16, 2012, respectively, the entire contents of which are incorporated as part of this application.

FIG. 1 is a circuit diagram exemplarily illustrating a unit memory cell of magnetic memory devices according to example embodiments of the inventive concept.

Referring to FIG. 1, a unit memory cell UMC may be disposed between first and second interconnection lines L1 and L2 crossing each other. The unit memory cell UMC may be connected in series to the first and second interconnection lines L1 and L2. The unit memory cell UMC may include a selection element SW and a magnetic tunnel junction MTJ. The selection element SW and the magnetic tunnel junction MTJ may be electrically connected in series to each other. In example embodiments, one of the first and second interconnection lines L1 and L2 may be used as a word line, and the other may be used as a bit line.

The selection element SW may be configured to selectively control an electric current passing through the magnetic tunnel junction MTJ. For example, as shown in FIGS. 2 through 6, the selection element SW may be one of a diode, a pnp bipolar transistor, an npn bipolar transistor, an NMOS field effect transistor (FET), and a PMOS FET. If the selection element SW is a three-terminal switching device, such as a bipolar transistor and/or MOSFET, an additional interconnection line (not shown) may be connected to the selection element SW.

The magnetic tunnel junction MTJ may include a first magnetic structure MS1, a second magnetic structure MS2, and a tunnel barrier TBR therebetween. The tunnel bather at TBR may include a non-magnetic material. In an embodiment, the tunnel barrier TBR may be formed of an insulating material layer. Alternatively, the tunnel barrier TBR may include a plurality of layers. For example, the tunnel barrier TBR may include magnesium (Mg), titanium (Ti), aluminum (Al), an oxide of magnesium-zinc (MgZn) and/or magnesium-boron (MgB), and/or a nitride of titanium (Ti) and/or vanadium (V). For example, the tunnel barrier TBR may be formed of a magnesium oxide (MgO) layer. Each of the first and second magnetic structures MS1 and MS2 may include at least one magnetic layer, which is formed of a magnetic material such as a ferromagnetic material. In certain embodiments, as shown in FIG. 1, the magnetic tunnel junction MTJ may further include a first conductive structure CS1, which may be interposed between the first magnetic structure MS1 and the selection device SW, and a second conductive structure CS2, which may be interposed between the second magnetic structure MS2 and the second interconnection line L2.

One of the magnetic layers of the first and second magnetic structures MS1 and MS2 may be configured to have a fixed magnetization direction, which is not changed by a weak external magnetic field generated under usual circumstances. Hereinafter, for convenience in description, a term 'pinned layer PNL' will be used to represent a magnetic layer having the fixed magnetization property. By contrast, the other of the magnetic layers of the first and second magnetic structures MS1 and MS2 may be configured to have a magnetization direction being switchable by angular momentum from a spin polarized current and/or an external magnetic field applied thereto for its operation. Hereinafter, a term 'free layer FRL' will be used to represent a magnetic layer having the switchable magnetization property. That is, as shown in FIGS. 7 and 8, the magnetic tunnel junction MTJ may include at least one free layer FRL and at least one pinned layer PNL, which are separated by the tunnel barrier TBR.

Electrical resistance of the magnetic tunnel junction MTJ may be sensitive to a relative orientation of magnetization directions of the free and pinned layers FRL and PNL. For example, the electrical resistance of the magnetic tunnel junction MTJ may be much greater when the relative magnetic orientation between the free and pinned layers FRL and PNL is antiparallel than when parallel. Thus, the electrical resistance of the magnetic tunnel junction MTJ may be controlled by changing the magnetization direction of the free layer FRL, and this difference in the electrical resistance can be used as a data storing mechanism for the magnetic memory devices according to example embodiments of the inventive concept.

Figure 7:
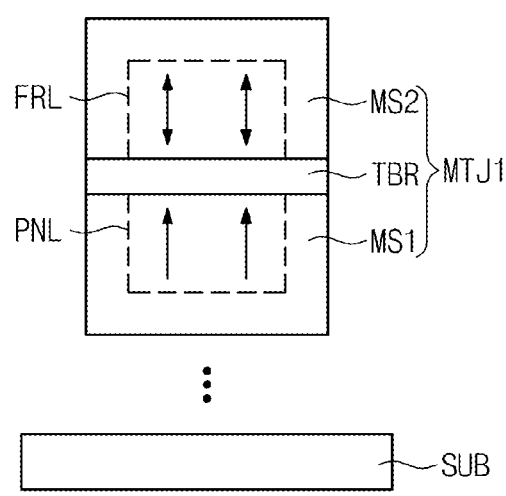
Figure 8:
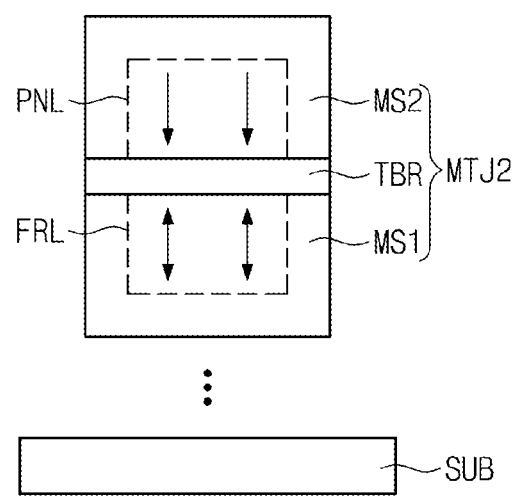

As shown in FIGS. 7 and 8, the first and second magnetic structures MS1 and MS2 of the magnetic tunnel junction MTJ may be sequentially formed on a substrate SUB. The substrate SUB may be a semiconductor substrate. The substrate SUB may include a conductive region and/or an insulating region. In example embodiments, according to a relative position between the free layer FRL and the substrate SUB or a stacking order of the free layer FRL and the pinned layer PNL, the magnetic tunnel junction MTJ may be, for example, classified into two types: (a) a first type of magnetic tunnel junction MTJ1 where the first and second magnetic structures MS1 and MS2 include the pinned layer PNL and the free layer FRL, respectively, as shown in FIG. 7, and (b) a second type of magnetic tunnel junction MTJ2 where the first and second magnetic structures MS1 and MS2 include the free layer FRL and the pinned layer PNL, respectively, as shown in FIG. 8.

According to some aspects of the inventive concept, one of the first and second magnetic structures MS1 and MS2 may be a free layer structure FLS to be described with reference to FIG. 9, and the other may be a pinned layer structure PLS to be described with reference to FIG. 10. The free layer structure FLS may be a multi-layer magnetic structure including the free layer FRL, and the pinned layer structure PLS may be a multi-layer magnetic structure including the pinned layer PNL.

Figure 9:
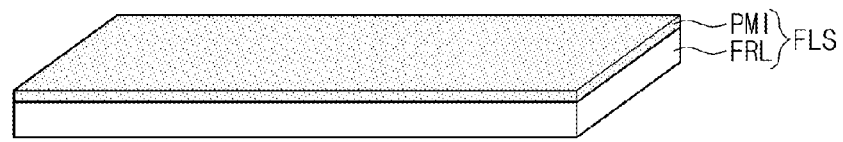
Figure 9:
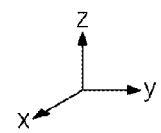

FIG. 9 is a perspective view exemplarily illustrating a free layer structure constituting a magnetic tunnel junction according to example embodiments of the inventive concept.

According to certain embodiments, the free layer structure FLS may include a free layer FRL and a perpendicular magnetization inducing layer PMI covering the free layer FRL, as shown in FIG. 9. The free layer structure FLS may be used as one of the first or second magnetic structures MS1 or MS2.

The free layer FRL may be formed of a magnetic material exhibiting an intrinsic in-plane magnetization property (hereinafter, referred to as to an "in-plane magnetic material"). Here, the intrinsic in-plane magnetization property means that a magnetization direction of a magnetic layer is oriented parallel to a longitudinal direction thereof, when there is no external factor applied thereto. For example, if a magnetic layer is provided in a thin film form, whose thickness (e.g., a z-directional length) is relatively smaller than its horizontal widths (e.g., x- and y-directional lengths), the magnetic layer having the intrinsic in-plane magnetization property may have a magnetization direction parallel to a xy-plane. The "intrinsic in-plane magnetization property", as will be used below, refers to the in-plane magnetization of a magnetic layer, which may be found in the absence of the external factor.

According to certain embodiments, for the free layer FRL, the intrinsic in-plane magnetization property may be realized by a single- or multi-layer structure including at least one of a cobalt, iron, nickel, or alloys thereof. For example, the free layer FRL may be a single- or multi-layer structure including at least one of a Fe, Co, Ni, CoFe, NiFe, NiFeB, CoFeB, CoFeBTa, CoHf, CoFeSiB or CoZr. In certain embodiments, the free layer FRL may be a multi-layered structure including a Fe layer, CoHf layer and CoFeB layer. The intrinsic in-plane magnetization materials for the free layer FRL are exemplarily described in order to provide better understanding of the inventive concept, but example embodiments of the inventive concepts may not be limited thereto. The free layer FRL may have a thickness ranging from about 6 Å to about 30 Å or, in certain embodiments, from about 10 Å to about 20 Å.

In certain embodiments, the free layer FRL may be provided in the form of a multi-layered structure including a pair of magnetic layers having the intrinsic in-plane magnetization property and a non-magnetic metal layer interposed therebetween. For example, the free layer FRL may include two layers made of a cobalt-iron-boron (CoFeB) alloy and a tantalum layer interposed therebetween. The tantalum layer in the free layer FRL may be formed to have a thickness of about 2 Å-20 Å.

The perpendicular magnetization inducing layer PMI may be in direct contact with the free layer FRL, and as the result of this direct contact, the magnetization direction of the free layer FRL may be changed to be substantially parallel to the thickness direction (for example, z direction) of the free layer FRL. In other words, the perpendicular magnetization inducing layer PMI may be an external factor allowing the free layer FRL having the intrinsic in-plane magnetization property to exhibit the perpendicular magnetization direction. In this respect, the perpendicular magnetization inducing layer PMI and the free layer FRL in contact with each other may constitute a structure exhibiting an extrinsic perpendicular magnetization property (hereinafter, referred to as an extrinsic perpendicular structure).

To realize the technical feature, the perpendicular magnetization inducing layer PMI may be formed of a material capable of inducing a stress on a surface of the free layer FRL being in contact therewith. In this sense, hereinafter, the perpendicular magnetization inducing layer PMI may be referred to as a 'stress-inducing layer' or a 'contact perpendicularing layer.' For example, the perpendicular magnetization inducing layer PMI may be formed of an oxygen-containing material. Alternatively, the perpendicular magnetization inducing layer PMI may be at least one of non-magnetic metal oxides. For example, the perpendicular magnetization inducing layer PMI may be provided in the form of a single- or multi-layered structure including at least one of tantalum oxide, magnesium oxide, ruthenium oxide, iridium oxide, platinum oxide, palladium oxide, titanium oxide, aluminum oxide, magnesium zinc oxide, hafnium oxide, or magnesium boron oxide. The materials having the stress-inducing property or the contact perpendicularing property are exemplarily described in order to provide a better understanding of the inventive concept, but the inventive concepts are not limited thereto.

If the perpendicular magnetization inducing layer PMI is formed of at least one of the non-magnetic metal oxides, the perpendicular magnetization inducing layer PMI may have electric resistivity higher than that of the free layer FRL. This means that electrical resistance of the magnetic tunnel junction MTJ may be strongly dependent on that of the perpendicular magnetization inducing layer PMI. To reduce this dependence, the perpendicular magnetization inducing layer PMI may be formed to have a thin structure. For example, the perpendicular magnetization inducing layer PMI may be thinner than the free layer FRL. In example embodiments, the perpendicular magnetization inducing layer PMI may have a thickness ranging from about 3 Å to about 10 Å or, in certain embodiments, from about 4 Å to about 6 Å.

Figure 10:
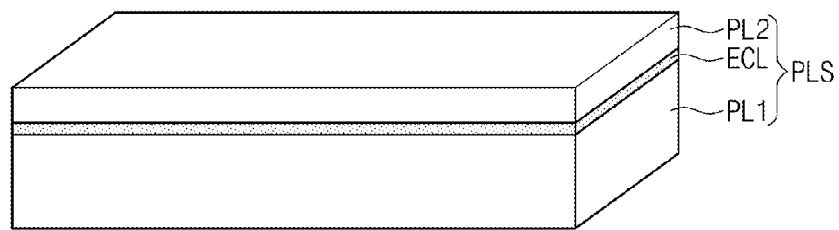
Figure 10:
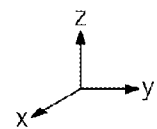

FIG. 10 is a perspective view exemplarily illustrating a pinned layer structure constituting a magnetic tunnel junction according to example embodiments of the inventive concept.

According to certain embodiments, the pinned layer structure PLS may include a first pinned layer (or first magnetic layer) PL1, a second pinned layer (or second magnetic layer) PL2, and an exchange coupling layer ECL interposed therebetween, as shown in FIG. 10. The pinned layer structure PLS may constitute one of the first and second magnetic structures MS1 and MS2.

The first pinned layer PL1 may be formed of a magnetic material exhibiting an intrinsic perpendicular magnetization property (hereinafter, referred to as a perpendicular magnetic material). Here, the intrinsic perpendicular magnetization property means that a magnetization direction of a magnetic layer is oriented substantially perpendicular to a thickness direction thereof, when there is no external factor applied thereto. For example, if a magnetic layer is provided in a thin film form, whose thickness (e.g., the z-directional length) is relatively smaller than its horizontal widths (e.g., the x- and y-directional lengths), the magnetic layer having the intrinsic perpendicular magnetization property may have a magnetization direction perpendicular to the xy-plane. The "intrinsic perpendicular magnetization property", as it will be referred to below, refers to the perpendicular magnetization of a magnetic layer, which may be found in the absence of the external factor.

According to certain embodiments, for the first pinned layer PL1, the intrinsic perpendicular magnetization property may be realized by a single- or multi-layered structure including cobalt-containing perpendicular magnetic materials.

In certain embodiments, the first pinned layer PL1 may be a single- or multi-layered structure including a cobalt-platinum alloy or cobalt-platinum alloys added with an element X, where the element X is at least one of boron, ruthenium, chromium, tantalum, or oxide. In other embodiments, the first pinned layer PL1 may be provided in the form of a multi-layered structure including cobalt-containing layers and noble metal layers alternatingly stacked on each other. The cobalt-containing layers may comprise cobalt, cobalt iron, cobalt nickel, cobalt chromium, or combinations thereof, and the noble metal layers may comprise platinum, palladium or combinations thereof. In still other embodiments, the first pinned layer PL1 may be provided in the form of a multi-layered structure including at least one of the materials (e.g., the cobalt-platinum alloy or cobalt-platinum alloys added with an element X) enumerated above with respect to certain embodiments and at least one of the materials (e.g., cobalt, cobalt iron, cobalt nickel, cobalt chromium, platinum, and palladium) enumerated in the other embodiments are provided. In some embodiments, the first pinned layer PL1 may have a thickness ranging from about 10 Å to about 80 Å or, from about 30 Å to about 55 Å.

The intrinsic perpendicular magnetization materials for the first pinned layer PL1 are exemplarily described in order to provide a better understanding of the inventive concept, but the inventive concepts are not limited thereto. For example, the first pinned layer PL1 may include at least one of a) CoFeTb, in which the relative content of Tb is 10% or more, b) CoFeGd, in which the relative content of Gd is 10% or more, c) CoFeDy, d) FePt with the $L1_0$ structure, e) FePd with the $L1_0$ structure, f) CoPd with the $L1_0$ structure, g) CoPt with the $L1_0$ structure, h) CoPt with the hexagonal close packing (HCP) structure, i) alloys containing at least one of materials presented in items of a) to h), or j) a multi-layered structure including magnetic and non-magnetic layers alternatingly stacked. The multi-layered structure including the alternatingly-stacked magnetic and non-magnetic layers may include at least one of (Co/Pt)n, (CoFe/Pt)n, (CoFe/Pd)n, (CoP)n, (Co/Ni)n, (CoNi/Pt)n, (CoCr/Pt)n, or (CoCr/Pd)n, where the subscript n denotes the stacking number. In certain embodiments, the first pinned layer PL1 may further include a cobalt layer or a cobalt-rich layer to be in contact with the exchange coupling layer ECL.

By contrast, the second pinned layer PL2 may be formed of a magnetic material exhibiting the intrinsic in-plane magnetization property (i.e., the in-plane magnetic material). In other words, the second pinned layer PL2 may have a magnetization direction oriented substantially parallel to a largest surface (e.g., the xy plane) thereof, when there is no external factor applied thereto.

For the second pinned layer PL2, the intrinsic in-plane magnetization property may be realized by a single- or multi-layered structure including at least one of cobalt, iron, or alloys thereof. For example, the second pinned layer PL2 may be a single- or multi-layered structure including at least one of CoFeB, CoFeBTa, CoHf, Co, CoFeSiB or CoZr. In example embodiments, the second pinned layer PL2 may be provided in the form of a dual-layered structure including a Co layer and a CoHf layer or a dual-layered structure including a CoFeBTa layer and a CoFeB layer.

In other example embodiments, the second pinned layer PL2 may be provided in the form of a multi-layered structure including a pair of magnetic layers having the intrinsic in-plane magnetization property and a non-magnetic metal layer interposed therebetween. For example, the second pinned layer PL2 may include two layers made of a cobalt-iron-boron (CoFeB) alloy and a tantalum layer interposed therebetween.

The intrinsic in-plane magnetization materials for the second pinned layer PL2 are exemplarily described in order to provide a better understanding of the inventive concepts, but the inventive concepts are not limited thereto. In certain embodiments, the second pinned layer PL2 may have a thickness ranging from about 5 Å to about 20 Å or, from about 10 Å to about 17 Å.

The exchange coupling layer ECL may comprise ruthenium, iridium, rhodium or combinations thereof. According to example embodiments of the inventive concept, as a result of an antiferromagnetic exchange coupling between the first and second pinned layers PL1 and PL2, the second pinned layer PL2 may have a magnetization substantially parallel to a thickness direction thereof. In other words, the exchange coupling layer ECL and the first pinned layer PL1 may provide an external factor allowing the second pinned layer PL2 having the intrinsic in-plane magnetization property to exhibit the perpendicular magnetization direction. In this respect, the first and second pinned layers PL1 and PL2 and the exchange coupling layer ECL therebetween may constitute an extrinsic perpendicular structure, whose perpendicular magnetization results from the antiferromagnetic exchange coupling.

The exchange coupling layer ECL may have a thickness selected in such a way that the second pinned layer PL2 can have a perpendicular magnetization antiparallel to that of the first pinned layer PL1. Furthermore, the exchange coupling layer ECL may have a thickness selected in such a way that the antiferromagnetic exchange coupling between the first and second pinned layers PL1 and PL2 can be maximized. As will be described with reference to FIG. 11, through experimentation, it was found that providing an exchange coupling layer ECL having a thickness ranging from about 2.5 Å to about 5.0 Å or, in certain embodiments, from about 3 Å to about 4 Å, was beneficial and exhibits unexpected results, especially when an annealing process during the fabrication of magnetic devices is under 300° C. However, the exchange coupling layer ECL may have a thickness ranging from about 2.5 Å to about 7.5 Å in certain process conditions, for example, when the anneal process is performed over 300° C. The thickness of the exchange coupling layer ECL may be increased when the annealing process is performed over 300° C. due to the interdiffusion or intermixing of the constituent magnetic layers.

In some embodiments, various magnetic layers to form the magnetic device of the present disclosure may be formed of COFeSiB.

Figure 11:
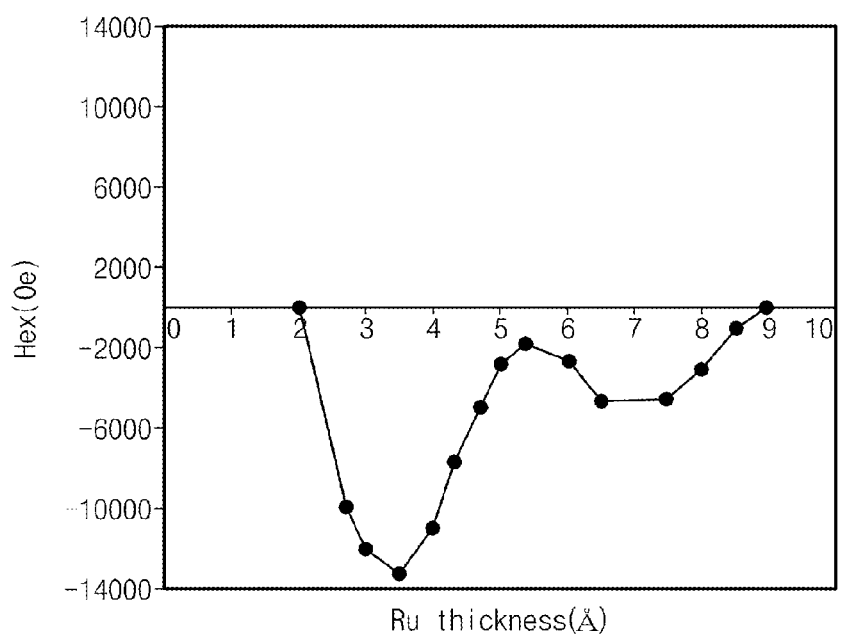

FIG. 11 is a graph provided to describe some aspects of the inventive concepts. In particular, FIG. 11 is a graph illustrating a dependence of a magnetic field intensity Hex of the exchange coupling on a thickness T of the exchange coupling layer, which was obtained from samples including the pinned layer structure PLS described with reference to FIG. 10. A negative Hex means that the system is in the antiferromagnetic coupling state.

Referring to FIG. 11, the exchange coupling intensity Hex had local minimums near 3.5 Å and 7 Å and had local maximum near 5.5 Å. In other words, the exchange coupling intensity Hex was about −5000 oe at 7 Å, about −2000 oe at 5.5 Å, and about −13000 oe at 3.5 Å. Here, the exchange coupling intensity Hex was smaller than that (i.e., −5000 oe) at 3.5 Å, when the exchange coupling layer has a thickness T ranging from 2.5 Å to 5.0 Å or from 3 Å to 4 Å.

In other words, when the thickness T of the exchange coupling layer is in a range between about 2.5 Å and about 5.0 Å, or more specifically between about 3 Å and about 4 Å, the exchange coupling intensity Hex had a global minimum. This means that, for this embodiment, when the exchange coupling layer has the thickness range (e.g., between about 2.5 Å and 5.0 Å, or more narrowly between about 3 Å and about 4 Å), the pinned layer structure PLS can exhibit a maximized antiferromagnetic coupling effect. It should also be noted, however, that the interaction with the tunnel barrier layer can further affect the antiferromagnetic coupling effect of the pinned layer structure PLS.

In some embodiments, the embodiments of the present disclosure may set the thickness of the exchange coupling layer corresponding to a first peak of Ruderman-Kittel-Kasuya-Yosida (RKKY) coupling shown in FIG. 11.

Figure 12:
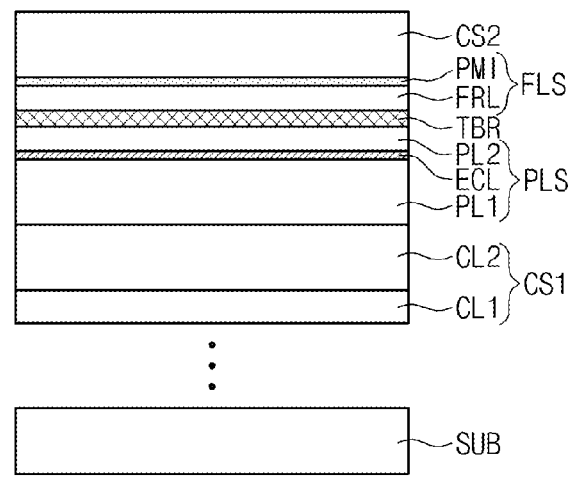
Figure 13:
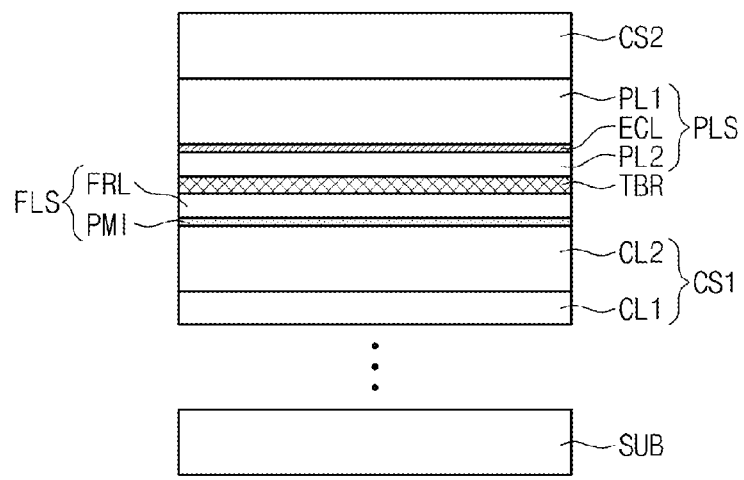

FIG. 12 is a cross-sectional view exemplarily illustrating a magnetic tunnel junction according to example embodiments of the inventive concepts, and FIG. 13 is a cross-sectional view exemplarily illustrating a magnetic tunnel junction according to other example embodiments of the inventive concepts.

Referring to FIG. 12, the pinned layer structure PLS, the tunnel barrier TBR, and the free layer structure FLS may be sequentially stacked on the substrate SUB. In other words, the free layer structure FLS and the pinned layer structure PLS may be configured to form the first type of the magnetic tunnel junction MTJ1 that was previously described with reference to FIG. 7.

According to the present embodiment, the first conductive structure CS1 may be disposed between the first type of the magnetic tunnel junction MTJ1 and the substrate SUB, and the second conductive structure CS2 may be provided on the first type of the magnetic tunnel junction MTJ1. In certain embodiments, the first conductive structure CS1 may serve as a seed layer for forming the first type of the magnetic tunnel junction MTJ1, and/or as an interconnection pattern or an electrode electrically connecting the selection device SW to the first type of the magnetic tunnel junction MTJ1. The second conductive structure CS2 may serve as a capping layer covering the first type of the magnetic tunnel junction MTJ1, and/or as an interconnection pattern or an electrode electrically connecting the first type of the magnetic tunnel junction MTJ1 and the second interconnection line L2.

In certain embodiments, the first conductive structure CS1 may include the first conductive layer CL1 and the second conductive layer CL2 sequentially stacked on the substrate SUB. The first conductive layer CL1 may be a CoHf layer or a Ta layer having a thickness of about 20 Å, and the second conductive layer CL2 may be a ruthenium layer having a thickness of about 40 Å. The materials for the first and second conductive layers CL1 and CL2 are exemplarily described in order to provide a better understanding of the inventive concepts, but the inventive concepts are not limited thereto.

The second conductive structure CS2 may be formed to cover the perpendicular magnetization inducing layer PMI, and be provided in the form of a single- or multi-layered structure including at least one of noble metal layers, magnetic alloy layers, or metal layers. For example, the noble metal layer for the second conductive structure CS2 may be formed of at least one of Ru, Pt, Pd, Rh, or Ir and the magnetic alloy layer may include at least one of Co, Fe, or Ni, and the metal layer may be formed of Ta or Ti. The materials for the second conductive structure CS2 are exemplarily described in order to provide a better understanding of the inventive concepts, but the inventive concepts are not limited thereto.

Referring to FIG. 13, the free layer structure FLS, the tunnel barrier TBR, and the pinned layer structure PLS may be sequentially stacked on the substrate SUB. In other words, the free layer structure FLS and the pinned layer structure PLS may be configured to form the second type of the magnetic tunnel junction MTJ2 that was previously described with reference to FIG. 8.

According to the present embodiment, the free layer structure FLS and the pinned layer structure PLS may be configured in such a way that both of the free layer FRL and the second pinned layer PL2 covers the tunnel bather TBR. Further, the first conductive structure CS1 may be provided between the second type of the magnetic tunnel junction MTJ2 and the substrate SUB, and the second conductive structure CS2 may be provided on the second type of the magnetic tunnel junction MTJ2. In some embodiments, the first conductive structure CS1 may serve as a seed layer for forming the second type of the magnetic tunnel junction MTJ2, and/or as an interconnection pattern or an electrode electrically connecting the selection device SW to the second type of the magnetic tunnel junction MTJ2. The second conductive structure CS2 may serve as a capping layer covering the second type of the magnetic tunnel junction MTJ2, and/or as an interconnection pattern or an electrode electrically connecting the second type of the magnetic tunnel junction MTJ2 and the second interconnection line L2.

In some embodiments, the first conductive structure CS1 may include the first conductive layer CL1 and the second conductive layer CL2, which may be sequentially stacked on the substrate SUB. The second conductive layer CL2 may be formed to cover the perpendicular magnetization inducing layer PMI, and be provided in the form of a single- or multi-layered structure including at least one of noble metal layers, magnetic alloy layers, or metal layers. The materials for the first conductive structure CS1 are exemplarily described in order to provide a better understanding of the inventive concepts, but the inventive concepts are not limited thereto.

Figure 14:
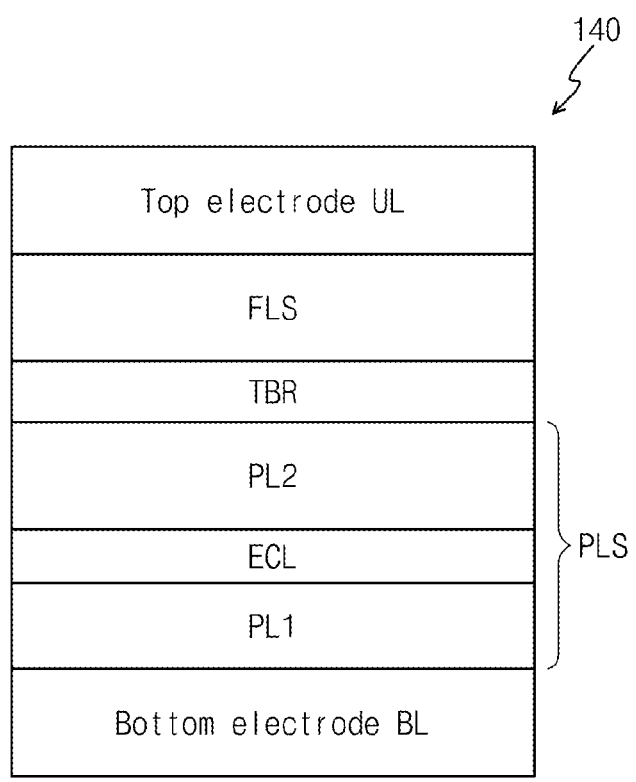

In some embodiment, as shown in FIG. 14, a magnetic device 140 may comprise a free layer structure FLS, a pinned layer structure PLS, and a tunnel barrier TBR therebetween. The pinned layer structure PLS may comprise a first magnetic layer PL1 having an intrinsic perpendicular magnetization property, a second magnetic layer PL2 having an intrinsic in-plane magnetization property, and an exchange coupling layer ECL interposed between the first and second magnetic layers PL1, PL2. The exchange coupling layer ECL may have a thickness selected to provide a desirable or maximum amount of antiferromagnetic exchange coupling between the first and second magnetic layers PL1 and PL2, such that the second magnetic layer PL2 exhibits an extrinsic perpendicular magnetization direction due at least in part to the antiferromagnetic exchange coupling with the first magnetic layer PL1. The amount of antiferromagnetic exchange coupling may be at least 4,000 Oe.

In some embodiments, the free layer structure FLS may not include a PMI layer discussed in connection with FIGS. 12 and 13.

In some embodiments, a ratio of a saturation magnetization value of the first magnetic layer PL1 with respect to a saturation magnetization value of the second magnetic layer PL2 ranges between about 0.6-about 1.5.

In some embodiments, a saturation magnetization value of the first magnetic layer PL1 is substantially the same as a saturation magnetization value of the second magnetic layer PL2. For example, the saturation magnetization value of each of the first and second magnetic layers PL1, PL2 may range from about 600 to 1400 emu/cc.

In some embodiments, the exchange coupling layer ECL may be, for example, ruthenium, iridium, or rhodium. In some embodiments, the thickness of the exchange coupling layer ECL is about 3 Å to about 4 Å.

In some embodiments, a thickness of the first magnetic layer (or first pinned layer) PL1 ranges from about 10 Å to about 80 Å and a thickness of the second magnetic layer (or second pinned layer) PL2 ranges from about 5 Å to about 20 Å.

In some embodiments, a $K_u$ value of the first magnetic layer PL1 is at least $3 \times 10^6$ erg. The Ku value is a perpendicular magnetic anisotropic energy (i.e., magnetic anisotropic energy in the direction perpendicular to the plane of the first magnetic layer PL1).

In some embodiments, the first magnetic layer PL1 may comprise a single layer of cobalt base alloy. In some embodiments, the first magnetic layer PL1 may comprise a multi-layer stack of $(Co_x/Pt_y)n$. In some embodiments, x/y ranges from 0.5 to 1.5.

In some embodiments, a magnetic device comprises a magnetic tunnel junction including a free layer structure, a pinned layer structure, and a tunnel barrier therebetween, The pinned layer structure may have a first magnetic layer having an intrinsic perpendicular magnetization property, a second magnetic layer having an intrinsic in-plane magnetization property, and an exchange coupling layer interposed between the first and second magnetic layers. The exchange coupling layer may have a thickness selected to provide a desirable amount of antiferromagnetic exchange coupling between the first and second magnetic layers, and the second magnetic layer exhibits an extrinsic perpendicular magnetization direction as a result of the antiferromagnetic exchange coupling with the first magnetic layer. The thickness of the exchange coupling layer may range from about 2.5 Å to about 7.0 Å.

In some other embodiments, although not illustrated, the free layer structure FLS may include another first magnetic layer similar to the first magnetic layer PL1 having an intrinsic perpendicular magnetization property, another second magnetic layer similar to the second magnetic layer PL2 having an intrinsic in-plane magnetization property, and another exchange coupling layer similar to the exchange coupling layer ECL interposed between the first and second magnetic layers PL1 and PL2. In one embodiment, in this case, the pinned layer structure PLS may not have the exchange coupling layer ECL sandwiched between the first and second magnetic layers as discussed above.

In some embodiments, both the free layer structure FLS and the pinned layer structure PLS may have the above described first and second magnetic layer structures PL1, PL2 having the exchange coupling layer ECL disposed therebetween.

In the other magnetic device structures, the separation ($\Delta H_{sw}$) between the coercivity of the free layer and the coercivity of the pinned layer may not be sufficient and the hysteresis loop of the free layer may not be symmetrical, making it nearly impossible to write data into memory cells. Further, if the stack height is greater than 30 nm, there is a difficulty in achieving higher integration of magnetic devices. In some cases, the hysteresis loop of the free layer and the pinned layer may undesirably overlaps, substantially reducing the switching probability and switching stability. Additionally, if the stack height is greater than 30 nm, there may be a difficulty in achieving higher integration of magnetic devices.

However, with some or all of the features described above, the free layer of the magnetic device of the present disclosure can have a symmetrical hysteresis loop and there can be large separation between the coercivity of the pinned layer and the coercivity of the free layer, thus significantly improving the writing probability and the switching stability.

Although the above described effects of the present disclosure may be obtained utilizing other embodiments or other combinations of the above described inventive features, inventors of the present disclosure have discovered that such inventive effects may be exceptional, for example, by forming a magnetic tunnel junction device including the pinned layer that comprises a first magnetic layer having an intrinsic perpendicular magnetization property, a second magnetic layer having an intrinsic in-plane magnetization property, and an exchange coupling layer interposed between the first and second magnetic layers, where the exchange coupling layer has a thickness selected to provide a desirable amount of antiferromagnetic exchange coupling between the first and second magnetic layers, such that the second magnetic layer exhibits an extrinsic perpendicular magnetization direction due at least in part to the antiferromagnetic exchange coupling with the first magnetic layer, the amount of antiferromagnetic exchange coupling being at least 4,000 Oe, where the magnetization value of the first magnetic layer is substantially the same as a saturation magnetization value of the second magnetic layer, where the exchange coupling layer is ruthenium, iridium, or rhodium, where the thickness of the exchange coupling layer is about 3 Å to about 4 Å, where the second magnetic layer comprises a single layer of cobalt base alloy or a multi-layer stack of $((Co_x/Pt_y)n$, where x is a thickness of a Co layer and y is a thickness of a Pt layer.

Figure 15:
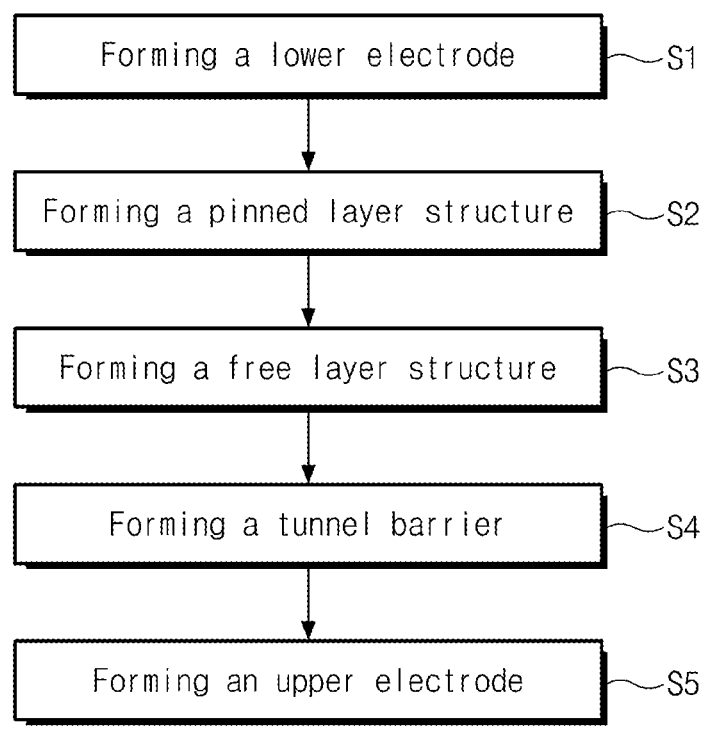

FIG. 15 is a flow chart exemplarily illustrating a method of fabricating a magnetic device according to some embodiments of the inventive concepts.

Referring to FIG. 15, a bottom electrode BL may be formed on a substrate SUB in step S1. A first magnetic layer PL1 having an intrinsic perpendicular magnetization property, an exchange coupling layer ECL, and a second magnetic layer PL2 having an intrinsic in-plane magnetization property are sequentially formed to form a pinned layer structure PLS on the bottom electrode BL in step S2. The thickness of the exchange coupling layer is selected to provide a desirable amount of antiferromagnetic exchange coupling between the first and second magnetic layers such that the second magnetic layer exhibits an extrinsic perpendicular magnetization direction due at least in part to the antiferromagnetic exchange coupling with the first magnetic layer. A saturation magnetization value of the first magnetic layer PL1 may be substantially the same as a saturation magnetization value of the second magnetic layer PL2. The amount of antiferromagnetic exchange coupling may be at least about 4,000 Oe. For example, the amount of antiferromagnetic exchange coupling may range from about 4,000 Oe to 10,000 Oe. The exchange coupling layer may be ruthenium, iridium, or rhodium, where the thickness of the exchange coupling layer may be about 3 Å to about 4 Å, and where the second magnetic layer may comprise a single layer of cobalt base alloy. Alternatively, the second magnetic layer may be formed by depositing a multi-layer stack of $(Co_x/Pt_y)n$, where x is a thickness of a Co layer and y is a thickness of a Pt layer. In Step S3, a tunnel barrier TBR may be formed on the pinned layer structure PLS. In Step S4, a free layer structure FLS is formed on the tunnel bather TBR. In step S5, an upper electrode UL is formed over the free layer structure FLS to form a magnetic device.

Also, a total thickness (stack height) of the magnetic device, e.g., lower and the upper electrodes and the magnetic tunnel junction disposed therebetween, can be equal to or smaller than about 15 nm Thus, with some embodiments of present disclosure, almost 50% reduction of the MTJ device thickness has been made possible. As a result, further scaling down of the magnetic device can be realized.

Figure 16:
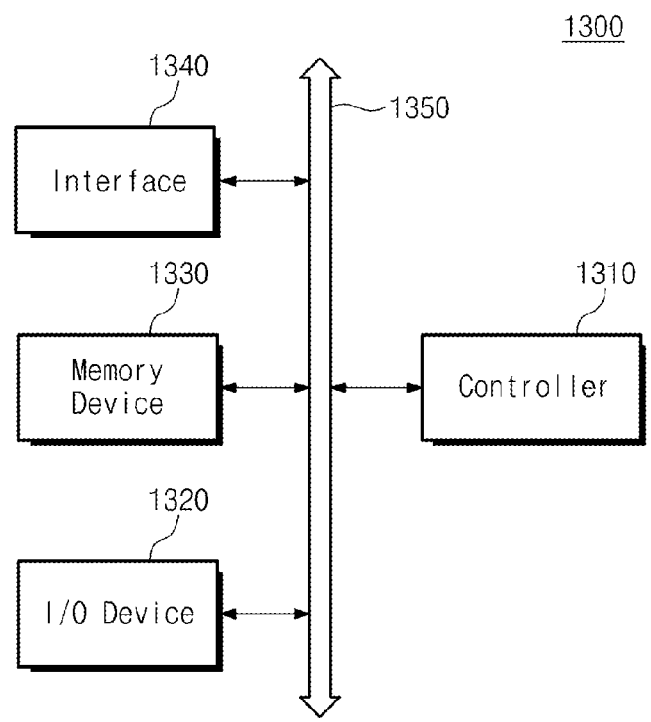
FIGS. 16 and 17 are block diagrams schematically illustrating electronic devices including a semiconductor device according to example embodiments of the inventive concept.
Figure 17:
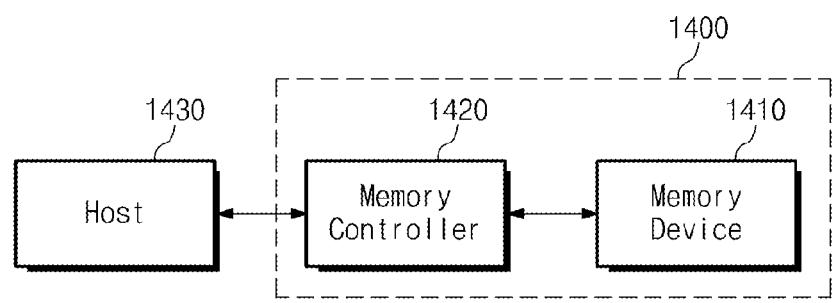

FIGS. 16 and 17 are block diagrams schematically illustrating electronic devices including a semiconductor device according to example embodiments of the inventive concept.

Referring to FIG. 16, an electronic device 1300 including a semiconductor device according to example embodiments of the inventive concept may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of the inventive concept. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 17, a memory system including a semiconductor device according to example embodiments of the inventive concept will be described. The memory system 1400 may include a memory device 1410 for storing large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of the inventive concept.

The semiconductor memory devices disclosed above may be encapsulated using various and diverse packaging techniques. For example, the semiconductor memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above example embodiments is mounted may further include at least one semiconductor device (e.g., a controller and/or a logic device) that controls the semiconductor memory device.

According to example embodiments of the inventive concept, the free layer and the second pinned layer may be formed of materials exhibiting an intrinsic in-plane magnetization property. For all that, the free layer may exhibit a perpendicular magnetization through contact with the perpendicular magnetization inducing layer, and the second pinned layer may exhibit a perpendicular magnetization through an enhanced antiferromagnetic exchange coupling with the first pinned layer that is made of an intrinsic perpendicular magnetization material. Since the in-plane magnetization materials exhibit the perpendicular magnetization property using external factors, the perpendicular magnetic tunnel junction can have a reduced thickness.

Furthermore, between the first and second pinned layers, there may be the exchange coupling layer enabling an antiferromagnetic exchange coupling between the first and second pinned layers. In example embodiments, the exchange coupling layer may be formed to have a thickness maximizing the antiferromagnetic exchange coupling between that the first and second pinned layers. This enables to reduce effectively a magnetic interaction between the free and second pinned layers.

A single MTJ structures discussed above are only some examples. The principles of the present disclosure may also be applied to spin logic devices. The spin logic devices may be, for example, all-spin logic (ASL) device and non-volatile spin logic device.

In addition, the inventive concept of the present disclosure may be applied to the formation of system-on-chip (SOC) devices requiring a cache. In such cases, the SOC devices may include a MTJ element formed according to the present disclosure coupled to a microprocessor.

Further, the principles of the present disclosure can be applied to other MTJ structures such as dual MTJ structures, where there are two reference layers with a free layer sandwiched therebetween.

Throughout the specification, features shown in one embodiment may be incorporated in other embodiments within the spirit and scope of the inventive concept.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used herein, the term magnetic could include ferromagnetic, ferromagnetic or the like. Thus, the term "magnetic" or "ferromagnetic" includes, for example, ferromagnets and ferrimagnets. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Various operations may be described as multiple discrete steps performed in a manner that is most helpful in understanding the invention. However, the order in which the steps are described does not imply that the operations are order-dependent or that the order that steps are performed must be the order in which the steps are presented.

With respect to the use of substantially any plural and/or singular terms herein, those having skill in the art can translate from the plural to the singular or from the singular to the plural as is appropriate to the context and/or application. The various singular/plural permutations may be expressly set forth herein for sake of clarity.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While example embodiments of the inventive concepts have been particularly shown and described, it will be understood by one of ordinary skill in the art that variations in form and detail may be made therein without departing from the spirit and scope of the attached claims.

What is claimed is:

1. A magnetic tunnel junction device comprising:
a free layer structure;
a pinned layer structure; and
a tunnel barrier between the free layer structure and the pinned layer structure,
wherein the pinned layer structure comprises:
a first magnetic layer having an intrinsic perpendicular magnetization property;
a second magnetic layer having an intrinsic in-plane magnetization property and extrinsic perpendicular magnetization direction; and
an exchange coupling layer interposed between the first and second magnetic layers,
wherein the exchange coupling layer has a thickness of about 2.5 Å to about 5.0 Å.

2. The device of claim 1, wherein the exchange coupling is antiferromagnetic exchange coupling.

3. The device of claim 2, wherein the exchange coupling layer is ruthenium, iridium, or rhodium.

4. The device of claim 1, further comprises a non-magnetic metal oxide layer covering directly the free layer structure.

5. A magnetic device, comprising:
a magnetic tunnel junction including a free layer structure, a pinned layer structure, and a tunnel barrier therebetween,
wherein the pinned layer structure comprises:
a first magnetic layer having an intrinsic perpendicular magnetization property;
a second magnetic layer having an intrinsic in-plane magnetization property; and
an exchange coupling layer interposed between the first and second magnetic layers,
wherein the exchange coupling layer has a thickness selected to provide a desirable amount of antiferromagnetic exchange coupling between the first and second magnetic layers, and
wherein the second magnetic layer exhibits an extrinsic perpendicular magnetization direction.

6. The device of claim 5, wherein the thickness of the exchange coupling layer is selected in such a way that the second magnetic layer has a perpendicular magnetization antiparallel to a magnetization direction of the first magnetic layer.

7. The device of claim 5, wherein the exchange coupling layer comprise ruthenium, iridium, rhodium or combinations thereof.

8. The device of claim 5, wherein the first magnetic layer comprises at least one of:
a single-layer structure made of cobalt-platinum alloy or cobalt-platinum alloy added with an element X, where the element X is at least one of boron, ruthenium, chromium, tantalum, or oxide; or
a multi-layer structure including cobalt-containing layers and noble metal layers alternatingly stacked on each other,
wherein the cobalt-containing layers are formed of one of cobalt, cobalt iron, cobalt nickel, or cobalt chromium, and the noble metal layers are formed of one of platinum and palladium.

9. The device of claim 5, wherein the second magnetic layer is a single- or dual-layered structure including at least one of Co, CoFeB, CoFeBTa, CoHf, or CoZr.

10. The device of claim 5, wherein the free layer structure comprises:
a free layer having the intrinsic in-plane magnetization property; and a non-magnetic metal oxide layer to induce a perpendicular magnetization property to the free layer.

11. The device of claim 10, wherein the free layer is a single- or multi-layer structure including at least one of Fe, Co, Ni, CoFe, NiFe, NiFeB, CoFeB, CoFeBTa, CoHf, or CoZr.

12. The device of claim 10, wherein the non-magnetic metal oxide layer is a single- or multi-layer structure including at least one of tantalum oxide, magnesium oxide, ruthenium oxide, iridium oxide, platinum oxide, palladium oxide, or titanium oxide and being in direct contact with the free layer.

13. The device of claim 5, further comprising,
a first conductive element connecting the magnetic tunnel junction to a switching device; and
a second conductive element connecting the magnetic tunnel junction to an interconnection line,
wherein the free layer structure is interposed between the first conductive element and the tunnel barrier or between the second conductive element and the tunnel barrier.

14. A magnetic memory device, comprising:
a lower electrode;
a magnetic tunnel junction over the lower electrode, the magnetic tunnel junction including a free layer structure, a pinned layer structure, and a tunnel barrier therebetween; and
an upper electrode over the magnetic tunnel junction,
wherein each of the free and pinned layer structures comprises an in-plane layer having an intrinsic in-plane magnetization property and a perpendicular magnetization inducing layer to induce a perpendicular magnetization property to the in-plane layer,
wherein the perpendicular magnetization inducing layer of the free layer structure comprises a non-magnetic metal oxide layer, and the perpendicular magnetization inducing layer of the pinned layer structure comprises an exchange coupling layer and a perpendicular layer having an intrinsic perpendicular magnetization property.

15. The device of claim 14, wherein the exchange coupling layer is disposed between the perpendicular layer and the in-plane layer of the pinned layer structure, and
the non-magnetic metal oxide layer is provided to cover directly the in-plane layer of the free layer structure.

16. The device of claim 14, wherein the exchange coupling layer is formed of at least one of ruthenium, iridium, or rhodium.

17. The device of claim 14, wherein the exchange coupling layer has the thickness maximizing the antiferromagnetic exchange coupling between the perpendicular layer and the in-plane layer of the pinned layer structure.

18. The device of claim 14, wherein the thickness of the exchange coupling layer ranges from about 2.5 Å to about 5.0 Å.

19. The device of claim 14, wherein the non-magnetic metal oxide layer is a single- or multi-layer structure including at least one of tantalum oxide, magnesium oxide, ruthenium oxide, iridium oxide, platinum oxide, palladium oxide, or titanium oxide.

20. The device of claim 14, wherein the perpendicular layer comprises at least one of cobalt-containing perpendicular magnetic materials.

* * * * *